United States Patent
Leng et al.

(10) Patent No.: US 11,121,362 B2
(45) Date of Patent: Sep. 14, 2021

(54) POSITIVE ELECTRODE SHEET FOR SECONDARY BATTERY, SECONDARY BATTERY, BATTERY MODULE, BATTERY PACK, AND APPARATUS

(71) Applicant: Contemporary Amperex Technology Co., Limited, Ningde (CN)

(72) Inventors: Xue Leng, Ningde (CN); Rui Du, Ningde (CN); Na Liu, Ningde (CN); Yongchao Liu, Ningde (CN); Huan Ni, Ningde (CN)

(73) Assignee: Contemporary Amperex Technology Co., Limited, Ningde (CN)

( * ) Notice: Subject to any disclaimer, the term of this patent is extended or adjusted under 35 U.S.C. 154(b) by 0 days.

(21) Appl. No.: 17/123,544

(22) Filed: Dec. 16, 2020

(65) Prior Publication Data
US 2021/0167366 A1 Jun. 3, 2021

Related U.S. Application Data

(63) Continuation of application No. PCT/CN2019/122332, filed on Dec. 2, 2019.

(51) Int. Cl.
| H01M 4/36 | (2006.01) |
| H01M 10/0525 | (2010.01) |
| H01M 4/1315 | (2010.01) |
| H01M 4/505 | (2010.01) |
| H01M 4/525 | (2010.01) |

(Continued)

(52) U.S. Cl.
CPC ............ *H01M 4/364* (2013.01); *C30B 29/22* (2013.01); *H01M 4/1315* (2013.01); *H01M 4/366* (2013.01); *H01M 4/505* (2013.01); *H01M 4/525* (2013.01); *H01M 10/0525* (2013.01); *H01M 2004/021* (2013.01); *H01M 2004/028* (2013.01)

(58) Field of Classification Search
None
See application file for complete search history.

(56) References Cited

FOREIGN PATENT DOCUMENTS

| CN | 105247709 A | 1/2016 | |
| CN | 105932321 A * | 9/2016 | ........ H01M 10/0525 |

(Continued)

OTHER PUBLICATIONS

International Search Report dated Jul. 28, 2020 in corresponding International application No. PCT/CN2019/122332; 5 pages.

(Continued)

*Primary Examiner* — Jonathan Crepeau
*Assistant Examiner* — Angela J Martin
(74) *Attorney, Agent, or Firm* — Maier & Maier, PLLC

(57) ABSTRACT

The present application provides a positive electrode sheet for a secondary battery, the positive electrode sheet includes a positive electrode current collector and a positive electrode active material layer on a surface of the positive electrode current collector, the positive electrode active material layer includes a positive electrode active material, the positive electrode active material includes a first lithium nickel transition metal oxide and a second lithium nickel transition metal oxide, the first lithium nickel transition metal oxide includes a first substrate and a first coating layer on a surface of the first substrate, the first substrate is secondary particles, and the second lithium nickel transition metal oxide is a single crystal or single-crystal-like morphological particles.

17 Claims, 3 Drawing Sheets

(51) Int. Cl.
    *C30B 29/22*    (2006.01)
    *H01M 4/02*     (2006.01)

(56)    References Cited

FOREIGN PATENT DOCUMENTS

| CN | 108432001 | A |   | 8/2018  |        |           |
|----|-----------|---|---|---------|--------|-----------|
| CN | 109004170 | A |   | 12/2018 |        |           |
| CN | 110120497 | A |   | 8/2019  |        |           |
| CN | 110233247 | A | * | 9/2019  | ...... | H01M 10/0525 |
| CN | 110265627 | A |   | 9/2019  |        |           |
| JP | 2016033848| A |   | 3/2016  |        |           |
| KR | 2011044375|   | * | 4/2011  | ...... | H01M 4/04 |

OTHER PUBLICATIONS

Written Opinion of the International Searching Authority dated Jul. 28, 2020 in corresponding International application No. PCT/CN2019/122332; 11 pages.

* cited by examiner

POSITIVE ELECTRODE SHEET FOR SECONDARY BATTERY, SECONDARY BATTERY, BATTERY MODULE, BATTERY PACK, AND APPARATUS

CROSS-REFERENCE TO RELATED APPLICATION

This application is a continuation of International Application No. PCT/CN2019/122332, filed on Dec. 2, 2019, which is hereby incorporated by reference in its entirety.

TECHNICAL FIELD

The present application relates to the field of electrochemistry, in particular to a positive electrode sheet for a secondary battery, the secondary battery, a battery module, a battery pack and an apparatus.

BACKGROUND

Requirement of an electric vehicle for driving range is higher and higher, which puts forward a higher requirement for energy density of power battery. The improvement of the energy density of the power battery largely depends on the choice of positive electrode material. According to the selection principles of high capacitance and high discharge voltage platform, lithium nickel transition metal oxides (for example, nickel-cobalt-manganese ternary materials) are more and more widely used. Where, the increase of nickel content may significantly increase gram capacitance, thus increasing energy density. Therefore, lithium nickel transition metal oxides with a high content of nickel are a current popular choice.

However, the increase of nickel content in the lithium nickel transition metal oxide makes preparation more difficult: serious lithium volatilization at a high temperature, and grains being not capable of sufficiently growing at a low temperature, which results in poor processability. At present, the mainstream lithium nickel transition metal oxide with a high content of nickel is secondary polycrystalline large particles aggregated by primary small grains. However, due to a large volume change in the direction of c axis during a charging and discharging process of the lithium nickel transition metal oxide with a high content of nickel, cracks easily occur among primary grains, thus deteriorating cycle performance.

In addition, the increase of nickel content in the lithium nickel transition metal oxide also affects stability of material structure, and intensifies transition from a surface layered structure to a rock salt phase, and surface oxygen release also intensifies side reactions of an electrolyte on a material surface.

SUMMARY

In view of the above-mentioned shortcomings in the prior art, an objective of the present application is to provide a positive electrode sheet for a secondary battery, the secondary battery, a battery module, a battery pack and an apparatus, which are used to solve problems in the prior art.

In order to achieve the above objective and other related objectives, a first aspect of the present application provides a positive electrode sheet for a secondary battery, the positive electrode sheet includes a positive electrode current collector and a positive electrode active material layer on a surface of the positive electrode current collector, the positive electrode active material layer includes a positive electrode active material, the positive electrode active material includes a first lithium nickel transition metal oxide and a second lithium nickel transition metal oxide, the first lithium nickel transition metal oxide includes a first substrate and a first coating layer on a surface of the first substrate, the first substrate is secondary particles, and a chemical formula of the first substrate is represented by Formula I:

$$Li_{1+a1}Ni_{x1}Co_{y1}Mn_{z1}M_{b1}O_{2-e1}X_{e1} \quad (I)$$

In the Formula I, $-0.1<a1<0.1$, $0.5 \leq x1 \leq 0.95$, $0.05 \leq y1 \leq 0.2$, $0.03 \leq z1 \leq 0.4$, $0 \leq b1 \leq 0.05$, $0 \leq e1 \leq 0.1$, and $x1+y1+z1+b1=1$; where M is one or more of Al, Ti, Zr, Nb, Sr, Sc, Sb, Y, Ba, B, Co, and Mn, and X is F and/or Cl;

the first coating layer is a metal oxide and/or a non-metal oxide;

the second lithium nickel transition metal oxide is a single crystal or single-crystal-like morphological particles;

a particle size distribution of the positive electrode active material satisfies: $40 < D_v90/D_v10 * D_v50 < 80$, unit: μm;

when the positive electrode sheet has a compaction density of 3.3 g/cm³~3.5 g/cm³, orientation index (OI) of the positive electrode sheet is 10~40.

A second aspect of the present application provides a method for preparing the positive electrode sheet for the secondary battery provided in the first aspect of the present application.

A third aspect of the present application provides a secondary battery including the positive electrode sheet according to the first aspect of the present application.

A fourth aspect of the present application provides a battery module including the secondary battery according to the third aspect of the present application.

A fifth aspect of the present application provides a battery pack including the battery module according to the fourth aspect of the present application.

A sixth aspect of the present application provides an apparatus including the secondary battery according to the third aspect of the present application, and the secondary battery is used as a power supply of the apparatus.

With respect to the prior art, the present application has beneficial effects that:

the present application is used in a positive electrode sheet for a secondary battery, a positive electrode active material includes a first lithium nickel transition metal oxide and a second lithium nickel transition metal oxide, where the first lithium nickel transition metal oxide is secondary particles that is subjected to a coating treatment, the second lithium nickel transition metal oxide is a single crystal or single-crystal-like structural single particles. By adjusting and controlling particle size distribution of a mixed positive electrode active material and OI value of the electrode sheet, the compressive strength of positive electrode active material particles in the positive electrode sheet is improved, the problem of particle cracking of the positive electrode active material particles is effectively restrained, and at the same time a relative content of (003) crystal plane perpendicular to the positive electrode sheet is reduced, so that an obtained secondary battery (for example, a lithium ion battery) has characteristics of high energy density, low gas production, low expansion rate of the electrode sheet, and the like, and has a good industrial prospect.

The battery module, the battery pack and the apparatus of the present application include the secondary battery, thus they have at least the same advantages as the secondary battery.

DETAILED DESCRIPTION OF EMBODIMENTS

Figure 1:
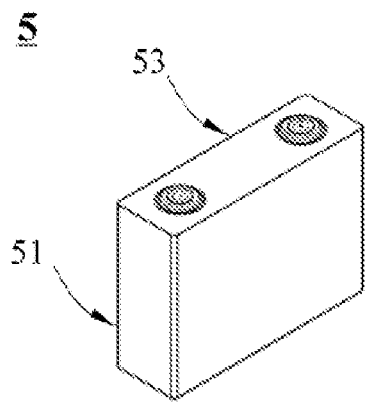
FIG. 1 is a perspective view of an embodiment of a battery.

In order to make objectives, technical solutions, and beneficial technical effects of the present application clearer, the present application will be further described in detail in combination with embodiments below. It should be understood that the embodiments described in the specification are merely intended for explaining the present application other than limiting the present application.

Positive Electrode Sheet

A first aspect of the present application provides a positive electrode sheet for a secondary battery, the positive electrode sheet includes a positive electrode current collector and a positive electrode active material layer on a surface of the positive electrode current collector, the positive electrode active material layer includes a positive electrode active material, the positive electrode active material includes a first lithium nickel transition metal oxide and a second lithium nickel transition metal oxide, the first lithium nickel transition metal oxide includes a first substrate and a first coating layer on a surface of the first substrate, the first substrate is secondary particles, and a chemical formula of the first substrate is represented by Formula I:

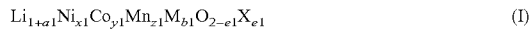

In the formula I, $-0.1 < a1 < 0.1$, $0.5 \leq x1 \leq 0.95$, $0.05 \leq y1 \leq 0.2$, $0.03 \leq z1 \leq 0.4$, $0 \leq b1 \leq 0.05$, $0 \leq e1 \leq 0.1$, and $x1+y1+z1+b1=1$; where M is one or more of Al, Ti, Zr, Nb, Sr, Sc, Sb, Y, Ba, B, Co, and Mn, and X is F and/or Cl;

the first coating layer is a metal oxide and/or a non-metal oxide;

the second lithium nickel transition metal oxide is a single crystal or single-crystal-like morphological particles;

a particle size distribution of the positive electrode active material satisfies: $40 < D_v90/D_v10 * D_v50 < 80$, unit: μm;

when the positive electrode sheet has a compaction density of 3.3 g/cm³~3.5 g/cm³, OI of the positive electrode sheet is 10~40.

In the present application, $D_v10$ is a corresponding particle size (unit: μm) when a volume cumulative distribution percentage of the positive electrode active material reaches 10%; $D_v50$ is a corresponding particle size (unit: μm) when the volume cumulative distribution percentage of the positive electrode active material reaches 50%; $D_v90$ is a corresponding particle size (unit: μm) when the volume cumulative distribution percentage of the positive electrode active material reaches 90%. The OI of the positive electrode sheet is a ratio of diffraction peak areas corresponding to (003) crystal plane and (110) crystal plane of a positive electrode active material in X-Ray Diffraction (XRD) diffraction spectrum of the positive electrode sheet.

In the positive electrode sheet for the secondary battery provided by the present application, the positive electrode active material layer includes the positive electrode active material, the positive electrode active material includes the first lithium nickel transition metal oxide and the second lithium nickel transition metal oxide, the first substrate in the first lithium nickel transition metal oxide is of polycrystalline morphology (secondary particles composed of primary particles) and is subjected to a coating treatment by the metal oxide and/or the non-metal oxide, and the second lithium nickel transition metal oxide is a single crystal or single-crystal-like morphological particles. In the present application, the single-crystal-like generally means that the size of the primary particle is larger than 1 μm, while there is a certain agglomeration among the primary particles; the single crystal generally means that the size of the primary particle is larger than 1 μm and there is no obvious agglomeration. According to the present application, by adjusting and controlling particle size distribution of a mixed positive electrode active material and OI value of the positive electrode sheet, the problem of particle cracking of the positive electrode active material particles is effectively restrained, the compressive strength of the positive electrode active material particles in the positive electrode sheet is improved, while a relative content of the (003) crystal plane of the positive electrode active material in the positive electrode sheet is reduced, and the problems of electrode sheet expansion rate and gas production are effectively solved, thereby obtaining an electrochemical energy storage apparatus with high energy density, low electrode sheet expansion rate and low gas production.

In the positive electrode sheet provided by the present application, when the positive electrode sheet has a compaction density of 3.3 g/cm³~3.5 g/cm³, the OI of the positive electrode sheet may be 10~15, 15~20, 20~25, 25~30, 30~35, or 35~40, preferably may be 10~20. Generally, the OI value of the positive electrode sheet reflects an overall orientation degree of a crystal plane of the positive electrode active material in the electrode sheet, and is closely related to process parameters of an electrode sheet manufacture procedure process, such as coating speed, drying, cold pressing, and so on. Too high OI value of the positive electrode sheet indicates that the relative content of (003) crystal plane perpendicular to the length direction of the positive electrode sheet is too high, and reflects that the positive electrode sheet has more serious texture after the cold pressing, and the electrode sheet is easy to expand during a process of battery charging and discharging; however, if the OI value of the positive electrode sheet is too low, it is indicated that the positive electrode active material in the positive electrode sheet has no obvious orientation at this time and particle strength is too low, and particle breakage is easy to occur in middle and later stages of the cold pressing and circulation, which leads to the problem of gas production.

In the positive electrode sheet provided by the present application, the second lithium nickel transition metal oxide includes a second substrate, and a chemical formula of the second substrate is represented by Formula II:

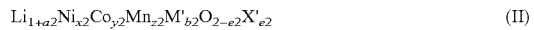

In the Formula II, $-0.1 < a2 < 0.1$, $0.5 \leq x2 \leq 0.95$, $0.05 \leq y2 \leq 0.2$, $0.03 \leq z2 \leq 0.4$, $0 \leq b2 \leq 0.05$, $0 \leq e2 \leq 0.1$, and $x2+y2+z2+b2=1$, where M' is one or more of Al, Ti, Zr, Nb, Sr, Sc, Sb, Y, Ba, B, Co, and Mn, and X' is F and/or Cl.

In the positive electrode sheet provided by the present application, molecular formulas of the first substrate and the second substrate may independently include but are not limited to $LiNi_{0.5}Co_{0.2}Mn_{0.3}O_2$, $LiNi_{0.5}Co_{0.25}Mn_{0.25}O_2$, $LiNi_{0.55}Co_{0.15}Mn_{0.3}O_2$, $LiNi_{0.55}Co_{0.1}Mn_{0.35}O_2$, $LiNi_{0.55}Co_{0.05}Mn_{0.4}O_2$, $LiNi_{0.6}Co_{0.2}Mn_{0.2}O_2$, $LiNi_{0.65}Co_{0.15}Mn_{0.2}O_2$, $LiNi_{0.65}Co_{0.12}Mn_{0.23}O_2$, $LiNi_{0.65}Co_{0.1}Mn_{0.25}O_2$, $LiNi_{0.65}Co_{0.05}Mn_{0.3}O_2$, $LiNi_{0.7}Co_{0.1}Mn_{0.2}O_2$, $LiNi_{0.75}Co_{0.1}Mn_{0.15}O_2$, $LiNi_{0.8}Co_{0.1}Mn_{0.1}O_2$, $LiNi_{0.85}Co_{0.05}Mn_{0.1}O_2$, $LiNi_{0.88}Co_{0.05}Mn_{0.07}O_2$, $LiNi_{0.9}Co_{0.05}Mn_{0.05}O_2$, $LiNi_{0.92}Co_{0.03}Mn_{0.05}O_2$, $LiNi_{0.95}Co_{0.02}Mn_{0.03}O_2$, etc., and may also be substances after the above-mentioned substances are modified by partial replacements with doped elements of M, M', X and X'. M and M' each is one or more of Al, Ti, Zr, Nb, Sr, Sc, Sb, Y, Ba, B, Co, and Mn, independently, while X and X' each is F and/or Cl, independently.

In some preferred embodiments of the present application, a relative content x1 of Ni element in the chemical formula of the first substrate may satisfy: $0.8 \le x1 \le 0.95$, $0.8 \le x1 \le 0.85$, $0.85 \le x1 \le 0.9$, or $0.9 \le x1 \le 0.95$, a relative content x2 of Ni element in the chemical formula of the second substrate may satisfy: $0.8 \le x2 \le 0$ $0.8 \le x1 \le 0.85$, $0.85 \le x1 \le 0.9$, or $0.9 \le x1 \le 0.95$, and the relative contents x1 and x2 of Ni in the first substrate and the second substrate may satisfy: $|x1-x2| \le 0.1$. Layered lithium transition metal oxides with a higher content of nickel are selected as the first lithium nickel transition metal oxide and the second lithium nickel transition metal oxide in the present application, which may effectively improve energy density of a battery; meanwhile, the difference between the relative contents x1 and x2 of Ni elements in the first substrate and the second substrate is not more than 0.1, which may achieve that the first lithium nickel transition metal oxide and the second lithium nickel transition metal oxide have a relatively close degree of lithium deintercalation/intercalation under a same charging and discharging voltage, and is beneficial to improve charging and discharging cycle life of the battery.

In some more preferred embodiments of the present application, the relative contents x1 and x2 of Ni elements in the first substrate and the second substrate satisfy: $0<x1-x2<0.1$. In the present application, the content x1 of Ni element of the first lithium nickel transition metal oxide is slightly higher than the content x2 of Ni element of the second lithium nickel transition metal oxide, which effectively balances the degree of lithium deintercalation/intercalation of the two positive electrode active materials and is beneficial for the battery to exert higher energy density.

In the positive electrode sheet provided by the present application, particle size and tap density (TD) of the positive electrode active material satisfy: $4.4<(D_v90-D_v10)/TD<8$. Specifically, the value range of $(D_v90-D_v10)/TD$ may be 7.5~8, 7~7.5, 6.5~7, 6~6.5, 5.5~6, 5~5.5, and 4.4~5. Preferably, $4.6<(D_v90-D_v10)/TD<6.5$. Where units of $D_v10$ and $D_v90$ are μm; TD is tap density of the positive electrode active material (unit: g/cm$^3$). In the present application, when the positive electrode active material further satisfies that a value of $(D_v90-D_v10)/TD$ is in the above range, the particle size distribution of particles with different morphologies of the positive electrode active material is moderate and gap volume between the particles is low, which are beneficial to improve the compaction density of the positive electrode sheet.

In the positive electrode sheet provided by the present application, the tap density TD of the positive electrode active material may be 2.2 g/cm$^3$~2.8 g/cm$^3$, 2.2 g/cm$^3$~2.3 g/cm$^3$, 2.3 g/cm$^3$~2.4 g/cm$^3$, 2.4 g/cm$^3$~2.5 g/cm$^3$, 2.5 g/cm$^3$~2.6 g/cm$^3$, 2.6 g/cm$^3$~2.7 g/cm$^3$, or 2.7 g/cm$^3$~2.8 g/cm$^3$. In the present application, TD is powder tap density of the positive electrode active material, and a specific measuring method of the powder tap density may include: filling powder into a container (for example, a 25 mL container, for another example, the container used may be a measuring cylinder), and vibrating the container (for example, specific vibrating conditions may be that: vibrating frequency is 250 times/min, vibrating amplitude is 3 mm, and vibration is 5000 times), and a mass of the power per unit volume is the powder tap density. Generally, the larger TD, the better it is to realize a high compaction density, however, TD has a certain upper limit due to the influence of factors such as compactness of an individual particle, particle size distribution of a material, and morphology of particles.

In the positive electrode sheet provided by the present application, the first lithium nickel transition metal oxide may be spherical particles, and the first lithium nickel transition metal oxide may have a sphericity degree γ of 0.7~1. Specifically, the sphericity degree γ of the first lithium nickel transition metal oxide may be 0.7~0.9, 0.7~0.8, 0.8~0.9, or 0.9~1. In the present application, the sphericity degree may be measured by the following way: selecting at least 30 secondary particles with a cross-sectional diameter above a $D_v10$ value of a positive electrode active material in a scanning electron microscopy (SEM) picture of a cross section of the positive electrode sheet, measuring a ratio of a maximum inscribed circle radius ($R_{max}$) to a minimum circumscribed circle radius ($R_{min}$) of each secondary particle in the SEM picture of the cross section, and averaging to obtain γ. In the present application, the first lithium nickel transition metal oxide is secondary particles, and when the sphericity degree of the secondary particles is within the above range, it indicates that primary particles in the secondary particles are uniform in size and distribution, and the secondary particles are compact and have high mechanical strength.

In the positive electrode sheet provided by the present application, a size ratio of a longest diameter $L_{max}$ to a shortest diameter $L_{min}$ of the second lithium nickel translation metal oxide satisfies: $1 \le L_{max}/L_{min} \le 3$, $1 \le L_{max}/L_{min} \le 1.5$, $1.5 \le L_{max}/L_{min} \le 2$, $2 \le L_{max}/L_{min} \le 2.5$, or $2.5 \le L_{max}/L_{min} \le 3$. In the present application, the $L_{max}/L_{min}$ may be measured by the following way: selecting at least 30 single crystal or single-crystal-like morphological particles with a cross-sectional diameter above a $D_v10$ value of a positive electrode active material in the SEM picture of the cross section of the positive electrode sheet, measuring a ratio of a longest diameter ($L_{max}$) to a shortest diameter ($L_{min}$) of each particle in the SEM picture of the cross section, and averaging to obtain $L_{max}/L_{min}$. In the present application, the second lithium nickel transition metal oxide is a single crystal or single-crystal-like morphological particles, and when $L_{max}/L_{min}$ of a single particle is within the above range, gap volume of the secondary particles can be better filled after the second lithium nickel transition metal oxide is mixed with the secondary particles having a sphericity degree of 0.7~1, which may effectively inhibit volume expansion rate of the positive electrode sheet in a cycle process and improve cycle performance while improving compaction density of the positive electrode sheet and volume energy density of the battery.

In the positive electrode sheet provided by the present application, $D_v50$ (L) of the first lithium nickel transition metal oxide may be 5 μm~18 μm, 5 μm~6 μm, 6 μm~8 μm, 8 μm~10 μm, 10 μm~12 μm, 12 μm~14 μm, 14 μm~16 μm, or 16 μm~18 μm, preferably 8 μm~12 μm. $D_v50$ (S) of the second lithium nickel transition metal oxide may be 1 μm~5 μm, 1 μm~2 μm, 2 μm~3 μm, 3 μm~4 μm, or 4 μm~5 μm.

A substrate in the first lithium nickel transition metal oxide is of polycrystalline morphology (secondary particles formed by agglomeration of a plurality of primary particles), and the second lithium nickel transition metal oxide is a single crystal or single-crystal-like morphological particles. Compared with the second lithium nickel transition metal oxide, the first lithium nickel transition metal oxide has a larger particle size distribution as a whole, and the particle size distribution $D_v50$ (L) and $D_v50$ (S) between them may more preferably satisfy: $2 \leq D_v50$ (L)/$D_v50$ (S)$\leq 7$, $2 \leq D_v50$ (L)/$D_v50$(S)$\leq 3$, $3 \leq D_v50$(L)/$D_v50$(S)$\leq 4$, $4 \leq D_v50$(L)/$D_v50$(S)$\leq 5$, $5 \leq D_v50$(L)/$D_v50$(S)$\leq 6$, or $6 \leq D_v50$ (L)/$D_v50$ (S)$\leq 7$. In the present application, when a ratio of the first lithium nickel translation metal oxide $D_v50$ (L) to the second lithium nickel transition metal oxide $D_v50$ (S) is within the above range, it is beneficial to suppress the problem of particle cracking of a secondary particle high-nickel material having a larger particle size, ensure that the positive electrode active material can exert higher gram capacitance, and improve mechanical strength and compaction density of the whole positive electrode sheet at the same time.

In the positive electrode sheet provided by the present application, a weight percentage content of the first lithium nickel transition metal oxide may be 50%~90%, 85%~90%, 80%~85%, 75%~80%, 70%~75%, 65%~70%, 60%~65%, 55%~60%, or 50%~55%, and preferably may be 60%~85%. A weight percentage content of the second lithium nickel transition metal oxide may be 10%~50%, 10%~15%, 15%~20%, 20%~25%, 25%~30%, 30%~35%, 35%~40%, 40%~45%, or 45%~50%, and preferably may be 15%~40%. In the present application, the weight percentages of the first lithium nickel transition metal oxide and the second lithium nickel transition metal oxide in the positive electrode sheet are controlled within the above range, which may adjust the OI value of the positive electrode sheet to a certain extent, and improve compaction density and mechanical strength of the electrode sheet at the same time.

In the positive electrode sheet provided by the present application, the second lithium nickel transition metal oxide may also include a second coating layer on a surface of the second substrate, and the second coating layer is a metal oxide and/or a non-metal oxide.

In the positive electrode sheet provided by the present application, the first coating layer and/or the second coating layer may be metal oxide and/or non-metal oxide, for example, an oxide containing only a metal element or a non-metal element, or an oxide containing both a metal element and a non-metal element. Among the above oxides, the metal element may generally be, for example, aluminum, zirconium, zinc, titanium, silicon, tin, tungsten, yttrium, cobalt, barium, etc., and the non-metal element may generally be, for example, phosphorus, boron, etc. Specifically, the first coating layer and/or the second coating layer may include but are not limited to one or more of alumina, zirconia, zinc oxide, titanium oxide, silicon oxide, tin oxide, tungsten oxide, yttrium oxide, cobalt oxide, barium oxide, phosphorus oxide, boron oxide, lithium aluminum oxide, lithium zirconium oxide, lithium zinc oxide, lithium magnesium oxide, lithium tungsten oxide, lithium yttrium oxide, lithium cobalt oxide, and lithium barium oxide. In the present application, the above-mentioned metal oxide and/or non-metal oxide is selected to use for a coating layer of the positive electrode active material, the oxide coating layer has a good bonding force with a substrate, the coating layer is not easy to fall off during a process of charging and discharging, and a portion of a contact area between the substrate and an electrolyte is reduced, which may effectively modify a surface of a high-nickel positive electrode material and reduce side reactions between the positive electrode material and the electrolyte, thereby may effectively inhibiting gas production phenomenon of the battery.

In the positive electrode material provided by the present application, the first coating layer preferably at least at the same time contains an oxide of one metal element and an oxide of one nonmetal element. Oxides containing the above elements can not only improve adhesion stability of the coating layer on a surface of a secondary particle substrate, but also enable the coating layer to have a certain ionic conductivity and electronic conductivity, reducing influence of the coating layer on polarization of the positive electrode material.

Method for Preparing Positive Electrode Sheet

A second aspect of the present application provides a method for preparing the positive electrode sheet for the secondary battery provided in the first aspect of the present application. A proper method for preparing the positive electrode sheet shall be known to persons of ordinary skill in the art. For example, the positive electrode sheet may include:

providing a positive electrode active material including a first lithium nickel transition metal oxide and a second lithium nickel transition metal oxide;

mixing the positive electrode active material, a binder, and a conductive agent to form a slurry, and coating the slurry on a positive electrode current collector.

In the method for preparing the positive electrode material provided by the present application, the first lithium nickel transition metal oxide and/or the second lithium nickel transition metal oxide may be surface-modified, for example, the first lithium nickel transition metal oxide and/or the second lithium nickel transition metal oxide may be surface-modified respectively and then mixed, where methods for modifying surfaces of the first lithium nickel transition metal oxide and the second lithium nickel transition metal oxide may be the same or different; the first lithium nickel transition metal oxide and the second lithium nickel transition metal oxide may also be mixed first, and then subjected to a surface modification process together.

In the method for preparing the positive electrode sheet provided by the present application, it may include: providing the first lithium nickel transition metal oxide. The method for providing the first lithium nickel transition metal oxide shall be known to persons of ordinary in the art, for example, it may include: mixing and sintering raw materials of a substrate of the first lithium nickel transition metal oxide to provide a first substrate; subjecting the first substrate to a coating treatment to provide the first lithium nickel transition metal oxide. Persons of ordinary in the art may select appropriate raw materials and proportion according to the elemental composition of the first lithium nickel transition metal oxide to further prepare and obtain the first substrate. For example, the raw materials of the first lithium nickel transition metal oxide may include a precursor of the first lithium nickel transition metal oxide, a lithium source, a M source, an X source, etc., and ratios between respective raw materials are generally based on ratios of respective elements in the first lithium nickel transition metal oxide. More specifically, the precursor of the first lithium nickel transition metal oxide may include but is not limited to $Ni_{0.5}Co_{0.2}Mn_{0.3}(OH)_2$, $Ni_{0.5}Co_{0.25}Mn_{0.25}(OH)_2$, $Ni_{0.55}Co_{0.15}Mn_{0.3}(OH)_2$, $Ni_{0.55}Co_{0.1}Mn_{0.35}(OH)_2$, $Ni_{0.55}Co_{0.05}Mn_{0.4}(OH)_2$, $Ni_{0.6}Co_{0.2}Mn_{0.2}(OH)_2$, $Ni_{0.65}Co_{0.15}Mn_{0.2}(OH)_2$, $Ni_{0.65}Co_{0.12}Mn_{0.23}(OH)_2$, $Ni_{0.65}Co_{0.1}Mn_{0.25}(OH)_2$, $Ni_{0.65}Co_{0.05}Mn_{0.3}(OH)_2$, $Ni_{0.7}Co_{0.1}Mn_{0.2}(OH)_2$, $Ni_{0.75}Co_{0.1}Mn_{0.15}(OH)_2$, $Ni_{0.8}Co_{0.1}Mn_{0.1}(OH)_2$, $Ni_{0.88}Co_{0.05}Mn_{0.07}(OH)_2$, $Ni_{0.92}Co_{0.03}Mn_{0.05}(OH)_2$, $Ni_{0.95}Co_{0.02}Mn_{0.03}(OH)_2$, etc. The lithium source may be a lithium-contained compound, where the lithium-contained compound may include but is not limited to one or more of $LiOH \cdot H_2O$, $LiOH$, $Li_2CO_3$, $Li_2O$, etc. The M source may generally be a M-contained compound, where the M-contained compound may be one or more of an oxide, a nitrate, a carbonate containing at least one element of Al, Ti, Zr, Nb, Sr, Sc, Sb, Y, Ba, Co. The X source may be an X-contained compound, where the X-contained compound may include but is not limited to one or more of LiF, Nacl, etc. A sintering condition of the raw materials of the substrate of the first lithium nickel transition metal oxide may be the sintering condition of 700~900° C. and an oxygen concentration of ≥20%. A method for subjecting the first substrate to the coating treatment specifically includes: sintering the first substrate in the presence of a compound containing a coating element, where the compound containing the coating element may be an oxide, a nitrate, a carbonate, etc. containing one or more elements of Al, Ba, Zn, Ti, Co, W, Y, Si, Sn, B, P, etc., an usage amount of the coating element may generally be ≤2 wt %, and the sintering condition in the coating treatment may be 200° C.~700° C.

In the method for preparing the positive electrode sheet provided by the present application, it may include: providing the second lithium nickel transition metal oxide. The method for providing the second lithium nickel transition metal oxide shall be known to persons of ordinary in the art, for example, it may include: mixing and sintering raw materials of a substrate of the second lithium nickel transition metal oxide to provide a second substrate; subjecting the second substrate to a coating treatment to provide the second lithium nickel transition metal oxide. Persons of ordinary in the art may select appropriate raw materials and proportion according to the elemental composition of the second lithium nickel transition metal oxide to further prepare and obtain the second substrate. For example, the raw materials of the second lithium nickel transition metal oxide may include a precursor of the second lithium nickel transition metal oxide, a lithium source, a M' source, an X' source, etc., and ratios between respective raw materials are generally based on ratios of respective elements in the second lithium nickel transition metal oxide. More specifically, the precursor of the second lithium nickel transition metal oxide may include but is not limited to $Ni_{0.5}Co_{0.2}Mn_{0.3}(OH)_2$, $Ni_{0.5}Co_{0.25}Mn_{0.25}(OH)_2$, $Ni_{0.55}Co_{0.15}Mn_{0.3}(OH)_2$, $Ni_{0.55}Co_{0.1}Mn_{0.35}(OH)_2$, $Ni_{0.55}Co_{0.05}Mn_{0.4}(OH)_2$, $Ni_{0.6}Co_{0.2}Mn_{0.2}(OH)$, $Ni_{0.65}Co_{0.15}Mn_{0.2}(OH)_2$, $Ni_{0.65}Co_{0.12}Mn_{0.23}(OH)$, $Ni_{0.65}Co_{0.1}Mn_{0.25}(OH)_2$, $Ni_{0.65}Co_{0.05}Mn_{0.3}(OH)_2$, $Ni_{0.7}Co_{0.1}Mn_{0.2}(OH)_2$, $Ni_{0.75}Co_{0.1}Mn_{0.15}(OH)_2$, $Ni_{0.8}Co_{0.1}Mn_{0.1}(OH)_2$, $Ni_{0.88}Co_{0.05}Mn_{0.07}(OH)_2$, $Ni_{0.92}Co_{0.03}Mn_{0.05}(OH)$, $Ni_{0.95}Co_{0.02}Mn_{0.03}(OH)_2$, etc. The lithium source may be a lithium-contained compound, where the lithium-contained compound may include but is not limited to one or more of $LiOH \cdot H_2O$, $LiOH$, $Li_2CO_3$, $Li_2O$, etc. The M' source may generally be a M'-contained compound, where the M'-contained compound may be one or more of an oxide, a nitrate, a carbonate containing at least one element of Al, Ti, Zr, Nb, Sr, Sc, Sb, Y, Ba, Co. The X' source may be an X'-contained compound, where the X'-contained compound may include but is not limited to one or more of LiF, Nacl, etc. A sintering condition of the raw materials of the substrate of the second lithium nickel transition metal oxide may be the sintering condition of 750~950° C. and an oxygen concentration of ≥20%. A method for subjecting the second substrate to the coating treatment specifically includes: sintering the second substrate in the presence of a compound containing a coating element, where the compound containing the coating element may be an oxide, a nitrate, a carbonate, etc. containing one or more elements of Al, Ba, Zn, Ti, Co, W, Y, Si, Sn, B, P, etc., an usage amount of the coating element may generally be ≤2 wt %, and the sintering condition in the coating treatment may be 200° C.~700° C.

In the method for preparing the positive electrode sheet provided by the present application, the binder generally includes a fluorine-containing polyolefin binder, and water is generally a good solvent for the fluorine-containing polyolefin binder, that is, the fluorine-containing polyolefin binder generally has a good solubility in water, for example, the fluorine-containing polyolefin binder may include but is not limited to a polyvinylidene fluoride (PVDF), a vinylidene fluoride copolymer, etc. or their modified (e.g., modified by a carboxylic acid, an acrylic acid, an acrylonitrile, etc.) derivatives, etc. In a positive electrode active material layer, a mass percentage content of the binder may be that the amount of the binder used should not be too high due to poor conductivity of the binder itself. Preferably, the mass percentage of the binder in the positive electrode active material layer is less than or equal to 0.5 wt %~3 wt %, so as to obtain a lower impedance of the electrode sheet.

In the method for preparing the positive electrode sheet provided by the present application, the conductive agent of the positive electrode sheet may be various conductive agents suitable for a lithium ion (secondary) battery in the field, for example, it may include but is not limited to one or more of an acetylene black, a conductive carbon black, a vapor grown carbon fiber (VGCF), a carbon nanotube (CNT), a Keqin black, etc. The weight of the conductive agent may account for 1 wt %~10 wt % of a total mass of the positive electrode active material layer. More preferably, a weight ratio of the conductive agent to the positive electrode active material in the positive electrode sheet is 1.0 wt %~5.0 wt %.

In the method for preparing the positive electrode sheet provided by the present application, the positive electrode current collector of the positive electrode sheet may generally be a layer body, and the positive electrode current collector may generally be a structure or a part capable of collecting current. The positive electrode current collector may be various materials suitable for being used as the positive electrode current collector of a lithium ion battery in the field, for example, the positive electrode current collector may include but is not limited to a metal foil, and more specifically may include but is not limited to a copper foil, an aluminum foil, etc.

Secondary Battery

A third aspect of the present application provides a secondary battery including the positive electrode sheet provided in the first aspect of the present application.

In the secondary battery provided by the present application, it should be noted that the secondary battery may be a super capacitor, a lithium ion battery, a lithium metal battery or a sodium ion battery. In an embodiment of the present application, only embodiment in which the secondary battery is a lithium ion battery is shown, but the present application is not limited thereto.

Figure 2:
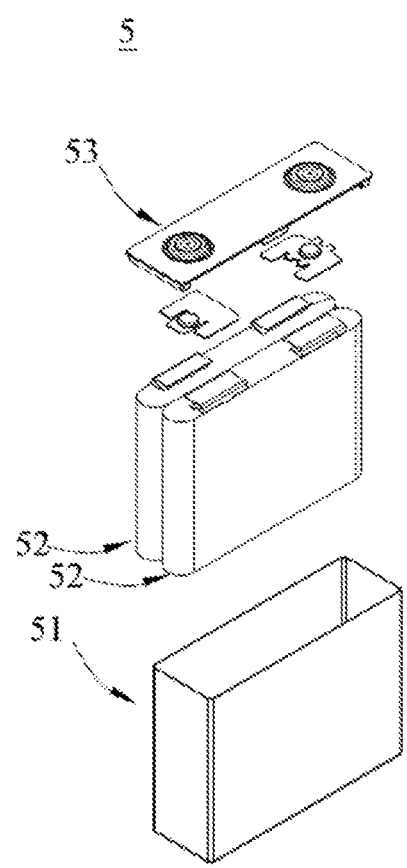
FIG. 2 is an exploded view of an embodiment of a battery.

FIG. 1 is a perspective view of a specific embodiment of a lithium ion battery. FIG. 2 is an exploded view of FIG. 1. Referring to FIG. 1 to FIG. 2, a battery 5 includes a housing 51, an electrode assembly 52, a top cover assembly 53, and an electrolyte (not shown). The electrode assembly 52 is accommodated in the housing 51. The number of the electrode assembly 52 is not limited and may be one or more.

It should be noted that the battery 5 shown in FIG. 1 is a can-type battery, but is not limited to this, and the battery 5 may be a bag-type battery, that is, the housing 51 is replaced by a metal plastic film and the top cover assembly 53 is removed.

In the lithium ion battery, it may include a positive electrode sheet, a negative electrode sheet, an isolation film spaced between the positive electrode sheet and the negative electrode sheet, and an electrolyte, where the positive electrode sheet may be the positive electrode sheet provided in the first aspect of the present application. A method for preparing a lithium ion battery shall be known to persons of ordinary in the art. For example, the positive electrode sheet, the isolation film and the negative electrode sheet respectively may be a layer, thus may be cut to a target size and then stacked in turn, and may also be wound to a target size to form a battery core, and may be further combined with the electrolyte to form the lithium ion battery.

In the lithium ion battery, the negative electrode sheet generally includes a negative electrode current collector and a negative electrode active material layer on a surface of the negative electrode current collector, where the negative electrode active material layer generally includes a negative electrode active material. The negative electrode active material may be various materials suitable for the negative electrode active material of the lithium ion battery in the field, for example, it may include but is not limited to one or more of graphite, soft carbon, hard carbon, carbon fiber, a mesophase carbon microsphere, a silicon-based material, a tin-based material, lithium titanate or other metals capable of forming an alloy with lithium. Where the graphite may be one or more of artificial graphite, natural graphite, and modified graphite; the silicon-based material may be one or more of silicon, a silicon-oxygen compound, a silicon-carbon composite and silicon alloy; the tin-based material may be one or more of tin, a tin oxide compound and a tin alloy. The negative electrode current collector is generally a structure or a part capable of collecting current. The negative electrode current collector may be various materials suitable for being used as the negative electrode current collector of the lithium ion battery in the field, for example, the negative electrode current collector may include but is not limited to a metal foil, etc., and more specifically may include but is not limited to a copper foil, etc.

In the lithium ion battery, the isolation film may be various materials suitable for the isolation film of the lithium ion battery in the field, for example, it may include but is not limited to one or more of polyethylene, polypropylene, polyvinylidene fluoride, aramid, polyethylene terephthalate, polytetrafluoroethylene, polyacrylonitrile, polyimide, polyamide, polyester and natural fiber, etc.

In the lithium ion battery, the electrolyte generally includes an electrolyte and a solvent, and a proper electrolyte suitable for the lithium ion battery shall be known to persons of ordinary in the art. For example, the electrolyte may generally include lithium salt, etc, more specifically, the lithium salt may be inorganic lithium salt and/or organic lithium salt, etc., particularly may include but is not limited to one or more of $LiPF_6$, $LiBF_4$, $LiN(SO_2F)_2$(LiFSI), $LiN(CF_3SO_2)_2$(LiTFSI), $LiClO_4$, $LiAsF_6$, $LiB(C_2O_4)_2$(LiBOB), $LiBF_2C_2O_4$(LiDFOB), etc; for another example, a concentration of the electrolyte may be between 0.8 mol/L~1.5 mol/L; for another example, the solvent used in the electrolyte may be various solvents suitable for the electrolyte of the lithium ion battery in the field, which is generally a non-aqueous solvent, preferably an organic solvent, in particular it may include but is not limited to one or more of vinyl carbonate, propylene carbonate, butylene carbonate, pentene carbonate, dimethyl carbonate, diethyl carbonate, dipropyl carbonate, methyl ethyl carbonate, etc. or their halogenated derivatives.

Battery Module

A fourth aspect of the present application provides a battery module including the secondary battery provided in the third aspect of the present application. Generally, one or more secondary batteries may be included in the battery module, and the battery module may be used as a power supply or an energy storage apparatus, and the number of the battery in the battery module may be adjusted according to application and capacitance of the battery module.

Figure 3:
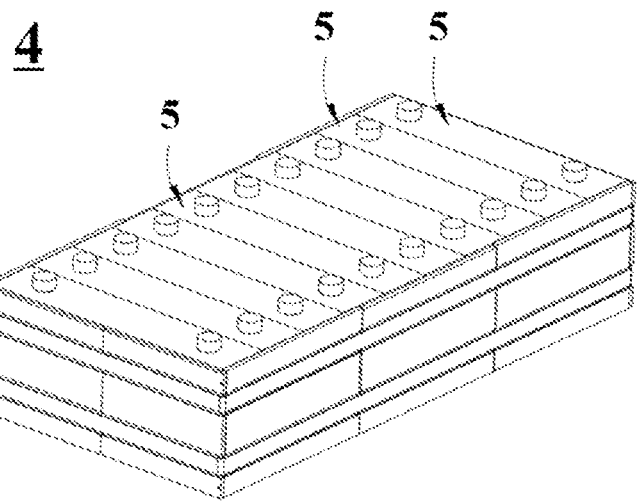
FIG. 3 is a perspective view of an embodiment of a battery module.

FIG. 3 is a perspective view of a specific embodiment of a battery module.

Referring to FIG. 3, a battery module 4 includes a plurality of batteries 5. The plurality of batteries 5 are arranged in a longitudinal direction.

Battery Pack

A fifth aspect of the present application provides a battery pack including the secondary battery provided in the third aspect of the present application or a battery module provided in the fourth aspect.

Figure 4:
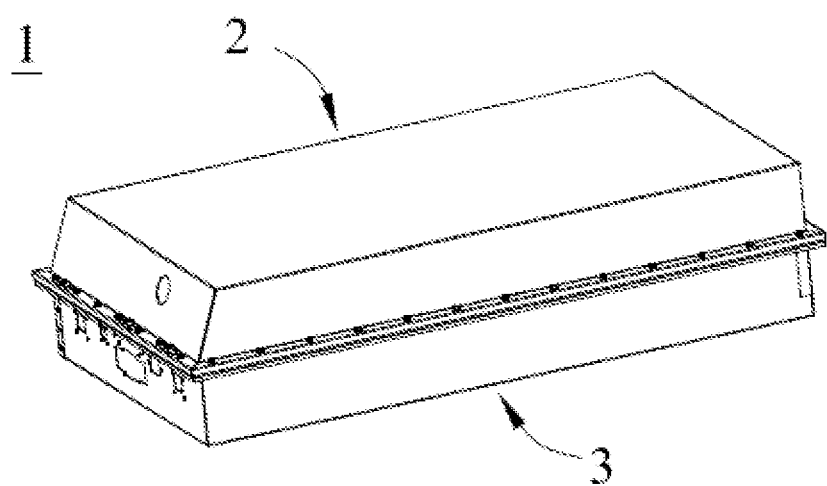
FIG. 4 is a perspective view of an embodiment of a battery pack.
Figure 5:
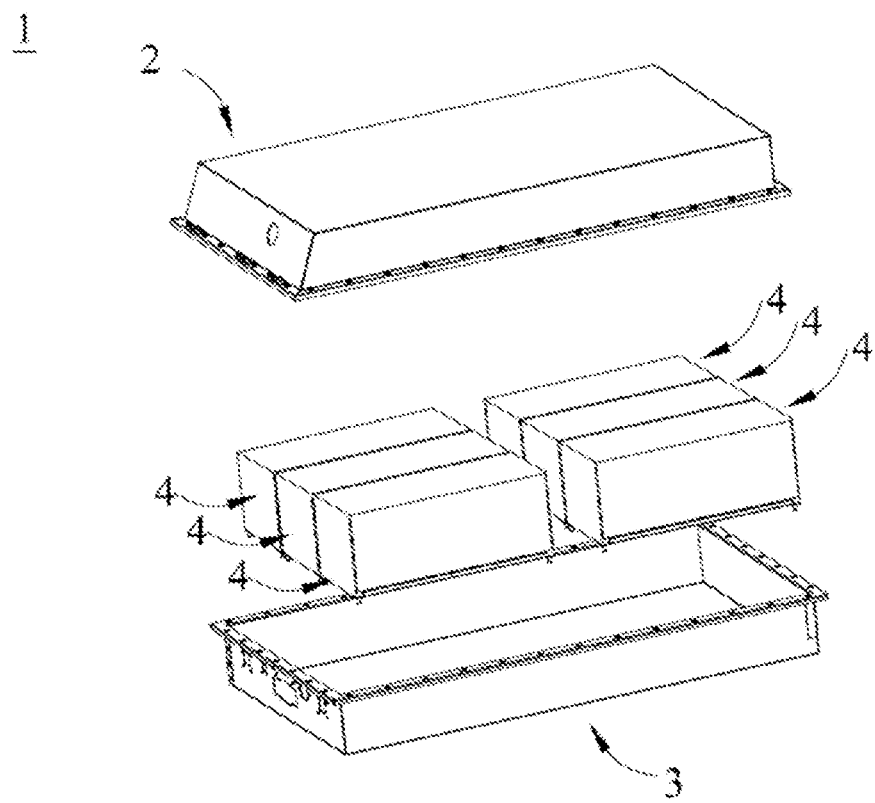
FIG. 5 is an exploded view of FIG. 4.

FIG. 4 is a perspective view of a specific embodiment of a battery pack 1. FIG. 5 is an exploded view of FIG. 4.

Referring to FIG. 4 and FIG. 5, the battery pack 1 includes an upper box body 2, a lower box body 3 and a battery module 4.

The upper box body 2 and the lower box body 3 are assembled together to form a space for accommodating the battery module 4. The battery module 4 is placed in the space of the upper box body 2 and the lower box body 3 assembled together. An output pole of the battery module 4 penetrates through one of or between the upper box body 2 and the lower box body 3 to supply power to an outside or charge from the outside. The number and arrangement of the battery module 4 used in the battery pack 1 may be determined according to actual needs. The battery pack 1 may be used as a power supply or an energy storage apparatus.

Apparatus

A sixth aspect of the present application provides an apparatus including the secondary battery provided in the third aspect of the present application, and the secondary battery is used as a power supply of the apparatus.

Figure 6:
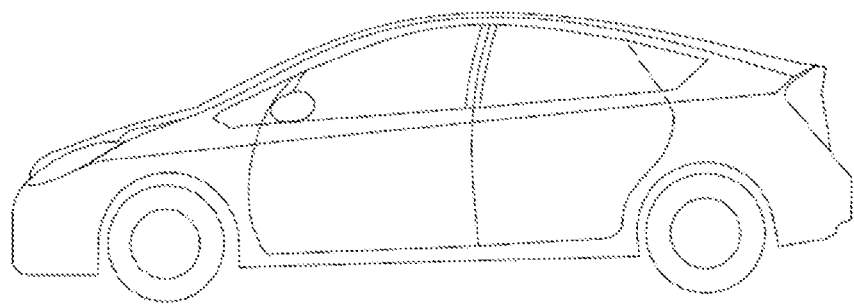
FIG. 6 is a schematic diagram of an embodiment of an apparatus using a battery as a power supply.

FIG. 6 is a perspective view of a specific embodiment of the above apparatus. In FIG. 6, the apparatus using the battery 5 is an electric car. It's not limited to that, of course, the apparatus using the battery 5 may be any electric vehicle (e.g., an electric bus, an electric tram, an electric bicycle, an electric motorcycle, an electric scooter, an electric golf cart, an electric truck) except for the electric car, electric ship, electric tool, electronic device and energy storage system. The electric car may be a pure electric vehicle, a hybrid electric vehicle and a plug-in hybrid electric vehicle. Of course, the apparatus provided in the sixth aspect of the present application may include the battery module 4 provided in the fourth aspect of the present application, and the apparatus provided in the sixth aspect of the present application may also include the battery pack 1 provided in the fifth aspect of the present application according to actual usage form.

The following will further illustrate beneficial effects of the present application in combination with embodiments.

In order to make application objectives, technical solutions and beneficial technical effects of the present application clearer, the present application will be described in further detail in combination with the following embodiments. However, it should be understood that the embodiments of the present application are merely intended for explaining the present application other than limiting the present application, and the embodiments of the present application are not limited to embodiments given in the specification. If specific experimental conditions or operating conditions are not indicated in the embodiments, the embodiments are carried out according to conventional conditions, or according to conditions recommended by material suppliers.

In addition, it should be understood that one or more steps of methods mentioned in the present application do not exclude that other steps of the methods may exist before and after the combined steps, or other steps of the methods may be inserted between the explicitly mentioned steps, unless otherwise noted; it should also be understood that a combined connection relationship between one or more devices/apparatuses mentioned in the present application does not exclude that other devices/apparatuses may exist before and after the combined devices/apparatuses, or other devices/apparatuses may be inserted between the two explicitly mentioned devices/apparatuses, unless otherwise noted. In addition, except as otherwise noted, the numbering of each of steps of methods is merely intended as a convenient tool for identifying each of steps of the methods, rather than limiting the ordering of each of steps of the methods or limiting implementable scope of the present application, and change or adjustment of its relative relationship is also regarded as the implementable scope of the present application without substantially changing technical contents.

In the following embodiments, reagents, materials and instruments used are commercially available unless otherwise noted.

Example 1

1. Preparation of a Positive Electrode Active Material 1) preparing precursors of a first lithium nickel transition metal oxide and a second lithium nickel transition metal oxide: preparing nickel sulfate, manganese sulfate, and cobalt sulfate into a 1 mol/L solution according to a molar ratio of 8:1:1, and preparing to obtain the precursor of the first lithium nickel transition metal oxide with a particle size $D_v50(L)$ of 9.7 pin by using hydroxide coprecipitation technology; preparing nickel sulfate, manganese sulfate and cobalt sulfate into a 1 mol/L solution according to a molar ratio, and preparing to obtain the precursor of the second lithium nickel transition metal oxide with a particle size of 2.9 μm by the hydroxide coprecipitation technology. In the process of preparing the precursors, the adjustment and control of the particle size and morphology of the precursors of the first lithium nickel transition metal oxide and the second lithium nickel transition metal oxide is achieve by controlling reaction time, pH value during coprecipitation and ammonia concentration;

2) a method for preparing the first lithium nickel transition metal oxide (polycrystalline $LiNi_{0.8}Co_{0.1}Mn_{0.1}O_2$):

placing the precursor $Ni_{0.8}Co_{0.1}Mn_{0.1}(OH)_2$ of the first lithium nickel transition metal oxide and a Li-containing compound $LiOH.H_2O$ in a molar ratio of 1:1.05 in a mixing device for mixing, then placing in an atmosphere furnace for sintering at 830° C., cooling and then mechanically grinding to obtain a substrate of the first lithium nickel transition metal oxide;

placing the substrate of the first lithium nickel transition metal oxide, a 0.2 wt % of compound $Al_2O_3$ containing coating element A1, and a 0.2 wt % of compound boric acid containing coating element B in the mixing device for mixing, and then placing in the atmosphere furnace for sintering at 500° C. for 5 h to form a first coating layer of the first lithium nickel transition metal oxide, that is to obtain the first lithium nickel transition metal oxide with a surface coated. $D_v50$, sphericity degree and coating material of the above-mentioned materials are shown in Table 1.

3) a method for preparing the second lithium nickel transition metal oxide (single crystal $LiNi_{0.8}Co_{0.1}Mn_{0.1}O_2$):

placing the precursor $Ni_{0.8}Co_{0.1}Mn_{0.1}(OH)_2$ of the second lithium nickel transition metal oxide and a Li-containing compound $LiOH H_2O$ with a molar ratio of 1:1.05 in the mixing device for mixing, then placing in the atmosphere furnace with an oxygen concentration of 30% for sintering at 870° C. for 4 h, cooling and then grinding by airflow powder to obtain a substrate of the second lithium nickel transition metal oxide;

placing the substrate of the second lithium nickel transition metal oxide and a 0.2 wt % of compound $Al_2O_3$ containing coating element A1 in the mixing device for mixing, and then placing in the atmosphere furnace for sintering at 500° C. for 5 h to form a coating layer of a lithium nickel transition metal oxide, that is to obtain the second lithium nickel transition metal oxide with a surface coated. $D_v50$, a ratio of $L_{max}/L_{min}$ and coating material of the above-mentioned materials are shown in Table 1.

4) uniformity mixing the above-mentioned surface-modified first lithium nickel transition metal oxide and the surface-modified second lithium nickel transition metal oxide in a mass ratio of 7:3 to obtain the positive electrode active material of Example 1. TD, $(D_v90-D_v10)/TD$, $D_v90/D_v10*D_v50$, and OI of a positive electrode sheet of the positive electrode active material in the Example 1 are shown in Table 1.

2. Preparation of a Battery

1) Preparation of a Positive Electrode Sheet

Step 1: mixing the positive electrode active material obtained as above, an adhesive polyvinylidene fluoride and a conductive agent acetylene black according to a mass ratio of 98:1:1, adding N-methylpyrrolidone (NMP), and uniformly stirring under action of a vacuum stirrer to obtain a positive electrode slurry; uniformly coating the positive electrode slurry on an aluminum foil with a thickness of 12 μm;

Step 2: drying the coated electrode sheet in an oven at 100° C. 130° C., and obtaining the positive electrode sheet via cold pressing and slitting.

2) Preparation of a Negative Electrode Sheet mixing a negative electrode active material graphite, a thickener sodium carboxymethyl cellulose, an adhesive styrene butadiene rubber and a conductive agent acetylene black according to a mass ratio of 97:1:1:1, adding deionized water, and obtaining a negative electrode slurry under action of a vacuum mixer; uniformly coating the negative electrode slurry on a copper foil with a thickness of 8 μm; airing the copper foil at room temperature then transferring to the oven for drying at 120° C. for 1 h, and then obtaining the negative electrode sheet via cold pressing and slitting.

3) Preparation of an Electrolyte

An organic solvent is a mixed solution containing ethylene carbonate (EC), methyl ethyl carbonate (EMC) and diethyl carbonate (DEC), where a volume ratio of EC, EMC, and DEC is 20:20:60. In an argon atmosphere glove box with a water content of <10 ppm, dissolving a lithium salt that is fully dried in the organic solvent, and uniformity mixing to obtain the electrolyte. Where the lithium salt has a concentration of 1 mol/L.

4) Preparation of an Isolation Film choosing a polypropylene isolation film with a thickness of 12 μm.

5) Preparation of a Battery

Stacking the positive electrode sheet, the isolation film, and the negative electrode sheet in sequence, so that the isolation film is between the positive and negative electrode sheets and plays an isolating role, winding into a square bare cell, then packing in an aluminum plastic film, baking at 80° C. to remove water, then injecting a corresponding non-aqueous electrolyte, sealing, subjecting to processes such as standing, hot and cold pressing, formation, clamping, capacitance grading, and so on, then obtaining a finished battery.

Example 2

Methods for preparing a positive electrode sheet and a battery in Example 2 refer to Example 1, except that the mass ratio between the first lithium nickel transition metal oxide and the second lithium nickel transition metal oxide is 9:1, and TD, $(D_v90-D_v10)/TD$, $D_v90/D_v10*D_v50$, and OI of a positive electrode sheet of a resulting positive electrode active material are shown in Table 1.

Example 3

Methods for preparing a positive electrode sheet and a battery in Example 3 refer to Example 1, except that the mass ratio between the first lithium nickel transition metal oxide and the second lithium nickel transition metal oxide is 6:4, and TD, $(D_v90-D_v10)/TD$, $D_v90/D_v10*D_v50$, and OI of a positive electrode sheet of a resulting positive electrode active material are shown in Table 1.

Example 4

Methods for preparing a positive electrode sheet and a battery in Example 4 refer to Example 1, except that an element ratio of Ni:Co:Mn in the second lithium nickel transition metal oxide is 5:2:3, the second lithium nickel transition metal oxide has a particle size $D_v50$ (S) of 4.3 μm, a $L_{max}/L_{min}$ of 1.5, and coating elements of Al and Ti, compounds used in the sintering process are alumina oxide and titanium oxide, the mass ratio between the first lithium nickel transition metal oxide and the second lithium nickel transition metal oxide is 8:2, and TD, $(D_v90-D_v10)/TD$, $D_v90/D_v10*D_v50$, and OI of a positive electrode sheet of a resulting positive electrode active material are shown in Table 1.

Example 5

Methods for preparing a positive electrode sheet and a battery in Example 5 refer to Example 1, except that an element ratio of Ni:Co:Mn in the first lithium nickel transition metal oxide is 6:2:2, the first lithium nickel transition metal oxide has a particle size $D_v50$ (L) of 9.6 μm, and a sphericity degree γ of 0.81, and TD, $(D_v90-D_v10)/TD$, $D_v90/D_v10*D_v50$, and OI of a positive electrode sheet of a resulting positive electrode active material are shown in Table 1.

Example 6

Methods for preparing a positive electrode sheet and a battery in Example 6 refer to Example 1, except that an element ratio of Ni:Co:Mn in the second lithium nickel transition metal oxide is 9:0.5:0.5, the mass ratio between the first lithium nickel transition metal oxide and the second lithium nickel transition metal oxide is 8:2, and TD, $(D_v90-D_v10)/TD$, $D_v90/D_v10*D_v50$, and OI of a positive electrode sheet of a resulting positive electrode active material are shown in Table 1.

Example 7

Methods for preparing a positive electrode sheet and a battery in Example 7 refer to Example 1, except that a coating element of the first lithium nickel transition metal oxide is B, that is, the compound corresponding to Al is not used for sintering, and TD, $(D_v90-D_v10)/TD$, $D_v90/D_v10*D_v50$, and OI of a positive electrode sheet of a resulting positive electrode active material are shown in Table 1.

Example 8

Methods for preparing a positive electrode sheet and a battery in Example 8 refer to Example 1, except that a coating element of the first lithium nickel transition metal oxide is B, that is, the compound corresponding to Al is not used for sintering, coating elements of the second lithium nickel transition metal oxide are Al and B, compounds used in the sintering process are alumina oxide and titanium oxide, and TD, $(D_v90-D_v10)/TD$, $D_v90/D_v10*D_v50$, and OI of a positive electrode sheet of a resulting positive electrode active material are shown in Table 1.

Example 9

Methods for preparing a positive electrode sheet and a battery in Example 9 refer to Example 1, except that an element ratio of Ni:Co:Mn in the first lithium nickel transition metal oxide is 8.3:1.4:0.3, the first lithium nickel transition metal oxide has a particle size $D_v50$ (L) of 12.3 μm, a sphericity degree γ of 0.85, and a coating element of Ba, a corresponding compound used for coating is barium oxide, the second lithium nickel transition metal oxide has a particle size $D_v50$ (S) of 2.2 μm, and a $L_{max}/L_{min}$ of 1.7, the mass ratio between the first lithium nickel transition metal oxide and the second lithium nickel transition metal oxide is 6:4, and TD, $(D_v90-D_v10)/TD$, $D_v90/D_v10*D_v50$, and OI of a positive electrode sheet of a resulting positive electrode active material are shown in Table 1.

Example 10

Methods for preparing a positive electrode sheet and a battery in Example 10 refer to Example 1, except that an element ratio of Ni:Co:Mn in the first lithium nickel transition metal oxide is 8.3:1.4:0.3, the first lithium nickel transition metal oxide has a particle size $D_v50$ (L) of 12.3 μm, and a sphericity degree γ of 0.85, a corresponding compound used for coating is barium oxide, an element ratio of Ni:Co:Mn in the second lithium nickel transition metal oxide is 5:2:3, the second lithium nickel transition metal oxide has a particle size $D_v50$ (S) of 4.3 μm, a $L_{max}/L_{min}$ of 1.5, and coating elements of Al and Ti, compounds used in the sintering process are alumina oxide and titanium oxide, the mass ratio between the first lithium nickel transition metal oxide and the second lithium nickel transition metal oxide is 5:5, and TD, $(D_v90-D_v10)/TD$, $D_v90/D_v10*D_v50$, and OI of a positive electrode sheet of a resulting positive electrode active material are shown in Table 1.

Comparative Example 1

Methods for preparing a positive electrode sheet and a battery in Comparative Example 1 refer to Example 1, the first lithium nickel transition metal oxide has a particle size $D_v50$ (L) of 7.8 μm and a sphericity degree γ of 0.77, an element ratio of Ni:Co:Mn in the second lithium nickel transition metal oxide is 5:2:3, the second lithium nickel transition metal oxide has a particle size $D_v50$ (S) of 4.3 μm, a $L_{max}/L_{min}$ of 1.5, and coating elements of Al and Ti, compounds used in the sintering process are alumina oxide and titanium oxide, and TD, $(D_v90-D_v10)/TD$, $D_v90/D_v10*D_v50$, and OI of a positive electrode sheet of a resulting positive electrode active material are shown in Table 1.

Comparative Example 2

Methods for preparing a positive electrode sheet and a battery in Comparative Example 2 refer to Example 1, except that the second lithium nickel transition metal oxide is not used in the method for preparing the positive electrode active material, and TD, $(D_v90-D_v10)/TD$, $D_v90/D_v10*D_v50$, and OI of a positive electrode sheet of a resulting positive electrode active material are shown in Table 1.

Comparative Example 3

Methods for preparing a positive electrode sheet and a battery in Comparative Example 3 refer to Example 1, except that the mass ratio between the first lithium nickel transition metal oxide and the second lithium nickel transition metal oxide is 4:6, and TD, $(D_v90-D_v10)/TD$, $D_v90/D_v10*D_v50$, and OI of a positive electrode sheet of a resulting positive electrode active material are shown in Table 1.

Comparative Example 4

Methods for preparing a positive electrode sheet and a battery in Comparative Example 4 refer to Example 9, except that the first lithium nickel transition metal oxide has a particle size $D_v50$ (L) of 16.8 μm, the second lithium nickel transition metal oxide has a particle size $D_v50$ (S) of 2.9 μm, and a $L_{max}/L_{min}$ of 2, the mass ratio between the first lithium nickel transition metal oxide and the second lithium nickel transition metal oxide is 9:1, and TD, $(D_v90-D_v10)/TD$, $D_v90/D_v10*D_v50$, and OI of a positive electrode sheet of a resulting positive electrode active material are shown in Table 1.

Comparative Example 5

Methods for preparing a positive electrode sheet and a battery in Comparative Example 5 refer to Example 1, except that the first lithium nickel transition metal oxide is not used in the method for preparing the positive electrode active material, and TD, $(D_v90-D_v10)/TD$, $D_v90/D_v10*D_v50$, and OI of a positive electrode sheet of a resulting positive electrode active material are shown in Table 1.

Comparative Example 6

Methods for preparing a positive electrode sheet and a battery in Comparative Example 6 refer to Example 1, except that a coating treatment is not performed during the preparation of the first lithium nickel transition metal oxide, and TD, $(D_v90-D_v10)/TD$, $D_v90/D_v10*D_v50$, and OI of a positive electrode sheet of a resulting positive electrode active material are shown in Table 1.

Detecting Method (1) Method for Testing Sphericity Degree of Secondary Particles:

taking a SEM picture of a cross section of a positive electrode sheet, selecting at least 30 secondary particles with a cross-sectional diameter above a $D_v10$ value of a positive electrode active material, measuring a ratio of a maximum inscribed circle radius ($R_{max}$) to a minimum circumscribed circle radius ($R_{min}$) of each secondary particle in the SEM picture, and averaging, i.e. the sphericity degree γ of the secondary particles could be obtained.

(2) Method for Testing $L_{max}/L_{min}$ of a Single Crystal/Single-Crystal-Like Particle:

in a SEM picture of a cross section of a positive electrode sheet, selecting at least 30 single crystals or single-crystal-like morphological particles with a cross-sectional diameter above a $D_v10$ value of a positive electrode active material, measuring a ratio of a longest diameter ($L_{max}$) to a shortest diameter ($L_{min}$) of each particle in the SEM picture, and averaging, i.e. $L_{max}/L_{min}$ could be obtained. Testing results of each of Examples and Comparative Examples are shown in Table 2.

(3) Method for Testing Tap Density TD:

Filling 10 g powder into a measuring cylinder with a measuring range of 25 mL, vibrating the filled measuring cylinder for 5000 times with a vibration frequency of 250 times/min and an amplitude of 3 mm, and reading a volume occupied by the powder in the measuring cylinder at this time to calculate and obtain a mass of the powder per unit volume, i.e. the tap density TD of the powder. Testing results of each of Examples and Comparative Examples are shown in Table 2.

(4) Method for Testing OI Value of a Positive Electrode Sheet:

horizontally placing a prepared positive electrode sheet in an XRD diffractometer to test XRD diffraction spectrum of the positive electrode sheet, and calculating a ratio of diffraction peak areas corresponding to (003) crystal plane and (110) crystal plane of the positive electrode active material in the XRD diffraction spectrum, that is the OI value of the positive electrode sheet. Testing results of each of Examples and Comparative Examples are shown in Table 2.

(5) Method for Testing Compaction Density:

1) cutting an electrode sheet into a film with a length of 1000 mm;

2) rolling the positive electrode sheet under a certain pressure to make the film has a length of 1006 mm, due to ductility of an aluminum foil;

3.) punching a small wafer of 1540.25 mm², and measuring the weight and thickness of the small wafer to calculate the compaction density;

Testing results of each of Examples and Comparative Examples are shown in Table 2.

(6) Method for Testing Capacitance Retention Rate at 45° C. for 400 Cycles:

at 45° C., charging a lithium ion battery to a voltage of 4.2V with a constant current of 1 C, then charging to a current of 0.05 C with a constant voltage of 4.2V, then discharging with a constant current of 1 C until a final voltage is 2.8V, and recording a discharge capacitance of a first cycle. Then charging and discharging are performed for 400 cycles according to the above-mentioned operation, and recording the discharge capacitance after 400 cycles. According to the discharge capacitance of the first cycle and the discharge capacitance after 400 cycles, the capacitance retention rate at 45° C. after 400 cycles is calculated.

Testing results of each of Examples and Comparative Examples are shown in Table 2.

(7) Test of Cyclic Direct Current Resistance (DCR) Growth:

At 25° C., charging a battery to 100% state of charge (SOC) with a 1 C constant current/constant voltage (charging to 4.2V with a constant current of 1 C, then charging to 0.05 C with a constant voltage of 4.2V), then discharging with a constant current of 1 C for 30 min, keeping for 60 min, and recording a voltage U1 after keeping; then discharging with a constant current of 4 C for 30 s, and recording a discharged voltage U2;

calculating a DCR of the lithium ion battery according to the formula: DCR=(U2−U1)/(4 C−1 C).

Testing results of each of Examples and Comparative Examples are shown in Table 2.

TABLE 1

| | First lithium nickel transition metal oxide | | | | Second lithium nickel transition metal oxide | | | |
| --- | --- | --- | --- | --- | --- | --- | --- | --- |
| Number | Component (element ratio of Ni:Co:Mn) | Particle size $D_v50$ (L)(μm) | Sphericity degree γ | Coating element | Component (element ratio of Ni:Co:Mn) | Particle size $D_v50$ (S)(μm) | $L_{max}/L_{min}$ | Coating element |
| Example 1 | 8:1:1 | 9.7 | 0.88 | Al, B | 8:1:1 | 2.9 | 2 | B |
| Example 2 | 8:1:1 | 9.7 | 0.88 | Al, B | 8:1:1 | 2.9 | 2 | B |
| Example 3 | 8:1:1 | 9.7 | 0.88 | Al, B | 8:1:1 | 2.9 | 2 | B |
| Example 4 | 8:1:1 | 9.7 | 0.88 | Al, B | 5:2:3 | 4.3 | 1.5 | Al, Ti |
| Example 5 | 6:2:2 | 9.6 | 0.81 | Al, P | 8:1:1 | 2.9 | 2 | B |
| Example 6 | 8:1:1 | 9.7 | 0.88 | Al, B | 9:0.5:0.5 | 2.9 | 2 | B |
| Example 7 | 8:1:1 | 9.7 | 0.88 | B | 8:1:1 | 2.9 | 2 | B |
| Example 8 | 8:1:1 | 9.7 | 0.88 | B | 8:1:1 | 2.9 | 2 | Al, B |
| Example 9 | 8.3:1.4:0.3 | 12.3 | 0.85 | Ba | 8:1:1 | 2.2 | 1.7 | B |
| Example 10 | 8.3:1.4:0.3 | 12.3 | 0.85 | Ba | 5:2:3 | 4.3 | 1.5 | Al, Ti |
| Comparative Example 1 | 8:1:1 | 7.8 | 0.77 | Al, B | 5:2:3 | 4.3 | 1.5 | Al, Ti |
| Comparative Example 2 | 8:1:1 | 9.7 | 0.88 | Al, B | \ | \ | \ | \ |
| Comparative Example 3 | 8:1:1 | 9.7 | 0.88 | Al, B | 8:1:1 | 2.9 | 2 | B |
| Comparative Example 4 | 8.3:1.4:0.3 | 16.8 | 0.85 | Ba | 8:1:1 | 2.9 | 2 | B |
| Comparative Example 5 | 8:1:1 | 9.7 | 0.88 | Al, B | 8:1:1 | 2.9 | 2 | B |
| Comparative Example 6 | 8:1:1 | 9.7 | 0.88 | \ | 8:1:1 | 2.9 | 2 | B |

| Number | Weight ratio of the first lithium nickel transition metal oxide | $D_v50(L)/D_v50(S)$ | TD (g/cm³) | $(D_v90 - D_v10)/TD$ | $D_v90/D_v10*D_v50$ | OI of a positive electrode sheet |
| --- | --- | --- | --- | --- | --- | --- |
| Example 1 | 70% | 3.3 | 2.6 | 5.5 | 66 | 15 |
| Example 2 | 90% | 3.3 | 2.5 | 5.4 | 47 | 10 |
| Example 3 | 60% | 3.3 | 2.2 | 6.3 | 60 | 17 |
| Example 4 | 80% | 2.3 | 2.7 | 4.9 | 40 | 16 |
| Example 5 | 70% | 3.3 | 2.4 | 4.9 | 51 | 17 |
| Example 6 | 80% | 3.3 | 2.5 | 5.7 | 63 | 13 |
| Example 7 | 70% | 3.3 | 2.6 | 5.5 | 66 | 15 |
| Example 8 | 70% | 3.3 | 2.6 | 5.5 | 66 | 15 |
| Example 9 | 60% | 5.6 | 2.2 | 7.8 | 88 | 17 |
| Example 10 | 50% | 2.9 | 2.4 | 6.6 | 47 | 38 |
| Comparative Example 1 | 70% | 1.8 | 2.4 | 2.9 | 21 | 20 |
| Comparative Example 2 | 100% | \ | 2.8 | 4.4 | 35 | 6 |
| Comparative Example 3 | 40% | 3.3 | 2.1 | 5.2 | 37 | 25 |
| Comparative Example 4 | 90% | 5.8 | 2.5 | 11 | 100 | 12 |
| Comparative Example 5 | 0% | 3.3 | 1.5 | 4.1 | 13.1 | 45 |
| Comparative Example 6 | 70% | 3.3 | 2.6 | 5.5 | 66 | 15 |

TABLE 2

| Number | Compaction density (g/cm³) | Capacitance retention rate at 45° C. for 400 cycles | Cyclic DCR growth |
|---|---|---|---|
| Example 1 | 3.58 | 94.1% | 20.0% |
| Example 2 | 3.52 | 93.5% | 13.0% |
| Example 3 | 3.55 | 94.0% | 26.0% |
| Example 4 | 3.51 | 94.9% | 10.0% |
| Example 5 | 3.50 | 94.7% | 8.0% |
| Example 6 | 3.56 | 93.5% | 21.0% |
| Example 7 | 3.58 | 93.1% | 62.0% |
| Example 8 | 3.58 | 94.3% | 55.0% |
| Example 9 | 3.5 | 91.0% | 88.0% |
| Example 10 | 3.52 | 93.0% | 43.0% |
| Comparative Example 1 | 3.4 | 94.3% | 23.0% |
| Comparative Example 2 | 3.47 | 92.9% | 11.0% |
| Comparative Example 3 | 3.47 | 93.0% | 50.0% |
| Comparative Example 4 | 3.45 | 89.0% | 90.0% |
| Comparative Example 5 | 3.27 | 92.8% | 150.0% |
| Comparative Example 6 | 3.58 | 80.0% | 130.0% |

It can be seen through the comparison of the Examples with the Comparative Examples that mixing a first lithium nickel transition metal oxide in the form of secondary particles with a second lithium nickel transition metal oxide in the form of a single crystal or single-crystal-like morphological particles, and controlling particle size distribution of a mixed positive electrode active material and 01 value of a positive electrode sheet, may improve particle cracking in a cycle process, improve cycle life and DCR growth in the cycle process while improving compaction density. Metal oxide and non-metal oxide coated on a surface may significantly improve the cycle life and cycle DCR growth.

The above-mentioned descriptions are merely preferred embodiments of the present application other than limiting the present application in any form or essence. It should be pointed out that some improvements and supplements may be made by persons of ordinary skill in the art without departing from methods of the present application, and these improvements and supplements should also be regarded as protection scope of the present application. Those who are familiar with the profession, without departing from the spirit and scope of the present application, may make equivalent changes of some replacements, modifications and evolution by using the technical contents disclosed above, which are all equivalent embodiments of the present application; meanwhile, replacement, modification and evolution of any equivalent changes made to the above-mentioned embodiments according to the essential technology of the present application still fall within the scope of the technical solutions of the present application.

What is claimed is:

1. A positive electrode sheet for a secondary battery, the positive electrode sheet comprising: a positive electrode current collector and a positive electrode active material layer on a surface of the positive electrode current collector, the positive electrode active material layer comprises a positive electrode active material, the positive electrode active material comprises a first lithium nickel transition metal oxide and a second lithium nickel transition metal oxide, the first lithium nickel transition metal oxide comprises a first substrate and a first coating layer on a surface of the first substrate, the first substrate is secondary particles, and a chemical formula of the first substrate is represented by Formula I:

$$Li_{1+a1}Ni_{x1}Co_{y1}Mn_{z1}M_{b1}O_{2-e1}X_{e1}$$ (Formula I)

in Formula I, $-0.1<a1<0.1$, $0.5<x1<0.95$, $0.05<y1<0.2$, $0.03<z1<0.4$, $0<b1<0.05$, $0<e1<0.1$, and $x1+y1+z1+b1=1$; wherein M is one or more of Al, Ti, Zr, Nb, Sr, Sc, Sb, Y, Ba, B, Co, and Mn, and X is F and/or Cl;
the first coating layer is a metal oxide and/or a non-metal oxide;
the second lithium nickel transition metal oxide is a single crystal or single-crystal-like morphological particles;
a particle size distribution of the positive electrode active material satisfies: $40<D_v90/D_v10*D_v50<80$, unit: μm; and
when the positive electrode sheet has a compaction density of 3.3 g/cm³~3.5 g/cm³, orientation index (OI) of the positive electrode sheet is 10~40.

2. The positive electrode sheet according to claim 1, wherein the second lithium nickel transition metal oxide comprises a second substrate, and a chemical formula of the second substrate is represented by Formula II:

$$Li_{1+a2}Ni_{x2}Co_{y2}Mn_{z2}M'_{b2}O_{2-e2}X'_{e2}$$ (Formula II)

in Formula II, $-0.1<a2<0.1$, $0.5\leq x2\leq 0.95$, $0.05\leq y2\leq 0.2$, $0.03\leq z2\leq 0.4$, $0\leq b2\leq 0.05$, $0\leq e2\leq 0.1$, and $x2+y2+z2+b2=1$, where M' is one or more of Al, Ti, Zr, Nb, Sr, Sc, Sb, Y, Ba, B, Co, and Mn, and X' is F and/or Cl; and
relative contents x1 and x2 of Ni elements in the first substrate and the second substrate satisfy:
$0.8\leq x1\leq 0.95$, $0.8\leq x2\leq 0.95$, and $|x1-x2|\leq 0.1$.

3. The positive electrode sheet according to claim 1, wherein when the positive electrode sheet has a compaction density of 3.3 g/cm³~3.5 g/cm³, the OI of the positive electrode sheet is 10~20.

4. The positive electrode sheet according to claim 1, wherein the positive electrode active material satisfies: $4.4<(D_v90-D_v10)/TD<8$,
wherein units of $D_v10$ and $D_v90$ are μm; tap density (TD) is tap density of the positive electrode active material (unit: g/cm³).

5. The positive electrode sheet according to claim 4, wherein the positive electrode active material has a tap density TD of 2.2 g/cm³~2.8 g/cm³.

6. The positive electrode sheet according to claim 1, wherein the first lithium nickel transition metal oxide is spherical particles, and the first lithium nickel transition metal oxide has a sphericity degree γ of 0.7~1.

7. The positive electrode sheet according to claim 1, wherein a size ratio of a longest diameter $L_{max}$ to a shortest diameter $L_{min}$ of the second lithium nickel translation metal oxide satisfies: $1\leq L_{max}/L_{min}\leq 3$.

8. The positive electrode sheet according to claim 1, wherein the first lithium nickel transition metal oxide has a $D_v50$ (L) of 5 μm~18 μm, the second lithium nickel transition metal oxide has a $D_v50$ (S) of 1 μm~5 μm;
the $D_v50(L)$ and the $D_v50(S)$ satisfies: $2\leq D_v50(L)/D_v50(S)\leq 7$.

9. The positive electrode sheet according to claim 1, wherein the first lithium nickel transition metal oxide has a weight percentage content of 50%~90% in the positive electrode active material; and
the second lithium nickel transition metal oxide has a weight percentage content of 10%~50%.

10. The positive electrode sheet according to claim 2, wherein the second lithium nickel transition metal oxide also comprises a second coating layer on a surface of the second substrate, the second coating layer is a metal oxide and/or a non-metal oxide.

11. A secondary battery comprising the positive electrode sheet according to claim 1.

12. An apparatus, comprising the secondary battery according to claim 11, wherein the secondary battery is used as a power supply for the apparatus, and the apparatus comprises an electric vehicle, a hybrid electric vehicle, a plug-in hybrid electric vehicle, an electric bicycle, an electric scooter, an electric golf cart, an electric truck, an electric ship, and an energy storage system.

13. The positive electrode sheet according to claim 1, wherein the single crystal comprises a primary particle larger than 1 μm and with no obvious agglomeration; and the single-crystal-like comprises a primary particle larger than 1 μm with a certain agglomeration between the primary particles.

14. The positive electrode sheet according to claim 1, wherein the OI of the positive electrode sheet is a ratio of diffraction peak areas corresponding to a first crystal plane and a second crystal plane of a positive electrode active material in X-Ray Diffraction (XRD) diffraction spectrum of the positive electrode sheet.

15. The positive electrode sheet according to claim 2, wherein the content x1 of Ni element of the first lithium nickel transition metal oxide is higher than the content x2 of Ni element of the second lithium nickel transition metal oxide.

16. The positive electrode sheet according to claim 2, wherein the contents x1 and the content x2 satisfy: $0<x1-x2<0.1$.

17. The positive electrode sheet according to claim 1, wherein, when compared with the second lithium nickel transition metal oxide, the first lithium nickel transition metal oxide has a larger particle size distribution.

* * * * *